(12) United States Patent
Chang

(10) Patent No.: US 12,376,227 B2
(45) Date of Patent: Jul. 29, 2025

(54) ELECTRONIC DEVICE AND MANUFACTURING METHOD THEREOF

(71) Applicant: Innolux Corporation, Miaoli County (TW)

(72) Inventor: Chi-Liang Chang, Miaoli County (TW)

(73) Assignee: Innolux Corporation, Miaoli County (TW)

(*) Notice: Subject to any disclaimer, the term of this patent is extended or adjusted under 35 U.S.C. 154(b) by 269 days.

(21) Appl. No.: 18/304,357

(22) Filed: Apr. 21, 2023

(65) Prior Publication Data

US 2024/0121889 A1     Apr. 11, 2024

Related U.S. Application Data

(60) Provisional application No. 63/345,429, filed on May 25, 2022.

(30) Foreign Application Priority Data

Feb. 17, 2023   (CN) .......................... 202310131338.X

(51) Int. Cl.
*H05K 1/18*   (2006.01)
*H05K 1/02*   (2006.01)
*H05K 3/00*   (2006.01)

(52) U.S. Cl.
CPC ............. *H05K 1/0271* (2013.01); *H05K 1/18* (2013.01); *H05K 3/0058* (2013.01); *H05K 2201/10545* (2013.01); *H05K 2203/166* (2013.01)

(58) Field of Classification Search
CPC ...... H05K 1/0271; H05K 1/18; H05K 3/0058; H05K 2201/10545; H05K 2203/166
USPC .......................................................... 361/760
See application file for complete search history.

(56) References Cited

U.S. PATENT DOCUMENTS 4,682,270 A * 7/1987 Whitehead ............ H01L 23/538
361/764
2020/0027804 A1 * 1/2020 Fang ....................... H01L 24/11

FOREIGN PATENT DOCUMENTS

TW         I724438        4/2021

* cited by examiner

*Primary Examiner* — Binh B Tran
(74) *Attorney, Agent, or Firm* — JCIPRNET

(57) ABSTRACT

An electronic device and a manufacturing method thereof are provided. The electronic device includes a circuit substrate, a plurality of electronic components, a plurality of carriers, and a bonding layer. The circuit substrate includes a circuit layer. The plurality of electronic components are disposed on the circuit substrate. The circuit layer is electrically connected to at least one of the plurality of electronic components. The plurality of carriers are disposed on the circuit substrate. The bonding layer bonds the plurality of carriers to the circuit substrate. At least one gap is between the plurality of carriers. A width of the gap is Wg. An average width of the plurality of carriers is Wa. A width of the circuit substrate is Wc. The electronic device satisfies: $Wa*2*10^{-4} < Wg < (Wc - Wa*2)$.

20 Claims, 12 Drawing Sheets

ELECTRONIC DEVICE AND MANUFACTURING METHOD THEREOF

CROSS-REFERENCE TO RELATED APPLICATION

This application claims the priority benefits of U.S. provisional application Ser. No. 63/345,429, filed on May 25, 2022 and China application serial no. 202310131338.X, filed on Feb. 17, 2023. The entirety of each of the above-mentioned patent applications is hereby incorporated by reference herein and made a part of this specification.

BACKGROUND

Technical Field

The disclosure relates to an electronic device and a manufacturing method thereof.

DESCRIPTION OF RELATED ART

In an electronic device, deformation or warpage, for example, is likely to be generated in different components and/or film layers due to different thermal expansion coefficients. In addition, in the electronic device, when heat dissipation is adversely affected or heat distribution is uneven, this may negatively affect the performance of electronic components.

SUMMARY

The disclosure provides an electronic device that helps improve at least one of the above issues.

According to an embodiment of the disclosure, an electronic device includes a circuit substrate, a plurality of electronic components, a plurality of carriers, and a bonding layer. The circuit substrate includes a circuit layer. The plurality of electronic components are disposed on the circuit substrate. The circuit layer is electrically connected to at least one of the plurality of electronic components. The plurality of carriers are disposed on the circuit substrate. The bonding layer bonds the plurality of carriers to the circuit substrate. At least one gap is between the plurality of carriers. A width of the gap is Wg. An average width of the plurality of carriers is Wa. A width of the circuit substrate is Wc. The electronic device satisfies: $Wa*2*10^{-4} < Wg < (Wc - Wa*2)$.

According to an embodiment of the disclosure, a manufacturing method of an electronic device includes the following. A circuit substrate is provided. A plurality of carriers are fixed to the circuit substrate by a bonding layer. At least one gap is between the plurality of carriers. A width of the gap is Wg. An average width of the plurality of carriers is Wa. A width of the circuit substrate is Wc. The electronic device satisfies: $Wa*2*10^{-4} < Wg < (Wc - Wa*2)$.

To make the aforementioned more comprehensible, several embodiments accompanied with drawings are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
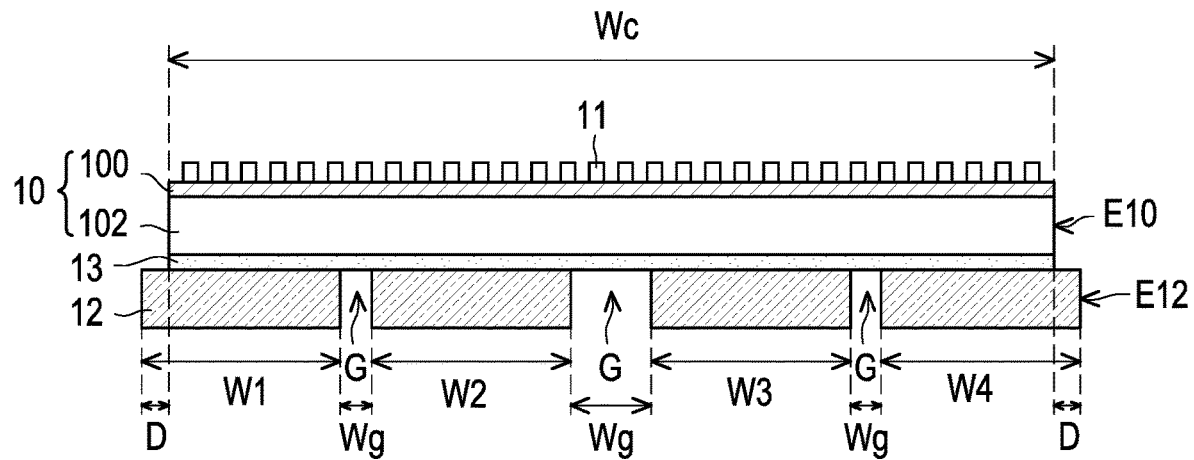
FIG. 1, FIG. 2, FIG. 7 to FIG. 9, FIG. 11, FIG. 13, FIG. 15, and FIG. 17 are schematic cross-sectional views of electronic devices according to some embodiments of the disclosure.

Reference will now be made in detail to the exemplary embodiments of the disclosure, examples of which are illustrated in the accompanying drawings. Wherever possible, the same reference numerals are used in the drawings and the description to refer to the same or similar parts.

Throughout the description of the disclosure and the appended claims, certain terms are used to refer to specific components. Those skilled in the art should understand that electronic device manufacturers may refer to the same components by different names. It is not intended herein to distinguish between components that have the same function but different names. In the following description and the claims, the terms "comprise" and "include" are open-ended terms, and should thus be interpreted to mean "comprise but not limited to . . . ".

The directional terms mentioned herein, like "above", "below", "front", "back', "left", "right", and the like, refer only to the directions in the accompanying drawings. Therefore, the directional terms are used for describing instead of limiting the disclosure. Each of the drawings illustrate typical features of methods, structures, and/or materials used in specific embodiments. Nonetheless, the drawings should not be interpreted as defining or limiting ranges or properties encompassed by these embodiments. For example, the relative sizes, thicknesses, and positions of film layers, regions, and/or structures may be reduced or enlarged for clarity.

In the disclosure, description that a structure (or layer, element, substrate) is located on/above another structure (or layer, element, substrate) may refer to that may refer to the case that the two structures are adjacent and directly connected, or the two structures are adjacent and non-directly connected. Non-direct connection refers to the case that at least one intermediary structure (or intermediary layer, intermediary element, or intermediary substrate, intermediary spacing) is present between two structures, where a lower side surface of one structure is adjacent to or directly connected to an upper side surface of the intermediary structure, and an upper side surface of the other structure is adjacent to or directly connected to a lower side surface of the intermediary structure. The intermediary structure may be composed of a single-layer or multi-layer physical structure or non-physical structure with no limitation. In the disclosure, when a structure is disposed "on" another structure, it may refer to the case that the structure is "directly" on the another structure, or the structure is "indirectly" on the another structure, namely at least one structure is further sandwiched between the structure and the another structure.

The term electrically connection or coupling described in the disclosure may each refer to direct connection or indirect connection. In the case of direct connection, end points of components on two circuits are directly connected or interconnected by a conductor line segment. In the case of indirect connection, present between end points of components on two circuits is a switch, a diode, a capacitor, an inductor, a resistor, other suitable components, or a combination of the above components, but not limited thereto.

In the disclosure, a thickness, a length, and a width may be obtained from measurement adopting an optical microscope (OM), and the thickness or width may be obtained from measuring a cross-sectional image shown in an electron microscope, but not limited thereto. In addition, certain errors may exist between any two values or directions for comparison. Furthermore, the terms "equal", "equivalent", "same", "substantially", or "essentially" mentioned in the disclosure generally represent that a value falls within 10% of a given value or range. Moreover, the description "a given range is a first value to a second value", "a given range falls within a range of a first value to a second value", or "a given range is between a first value and a second value" indicates that the given range includes the first value, the second value, and other values in between. If a first direction is perpendicular to a second direction, the angle between the first direction and the second direction may be between 80 degrees and 100 degrees. If a first direction is parallel to a second direction, the angle between the first direction and the second direction may be between 0 degree and 10 degrees.

Note that features in different embodiments described below may be replaced, recombined, or mixed to form another embodiment without departing from the spirit of the disclosure. The features in the embodiments may be arbitrarily used in mixture or combination without departing from the spirit of the disclosure or conflicting with each other.

Unless otherwise defined, all terms (including technical and scientific terms) used herein have the same meaning as commonly understood by one of ordinary skill in the art related to the disclosure. It will be understandable that terms, such as those defined in commonly used dictionaries, should be interpreted to have a meaning that is consistent with their meaning in the related art and the context of the disclosure, and should not be interpreted in an idealized or overly formal sense unless particularly so defined in the embodiments of the disclosure.

In the disclosure, an electronic device may include a display device, a backlight device, an antenna device, a sensing device, or a tiled device, but not limited thereto. The electronic device may be a bendable or flexible electronic device. The display device may be a non-self-luminous-mode display device or a self-luminous-mode display device. The display device may include, for example but not limited to, a liquid crystal, a light-emitting diode (LED), fluorescence, phosphor, a quantum dot (QD), other suitable display media, or a combination thereof. The antenna device may include, for example, a frequency selective surface (FSS), a radio-frequency-filter (RF-Filter), a polarizer, a resonator, an antenna, or the like. The antenna may be in a liquid crystal form or non-liquid crystal form. The sensing device may sense capacitance, light rays, thermal energy, or ultrasonic waves, but not limited thereto. In the disclosure, the electronic device may include an electronic element. The electronic element may include a passive element and an active element, such as a capacitor, a resistor, an inductor, a diode, a transistor, or the like. The diode may include a light-emitting diode or a photodiode. The light-emitting diode may include, for example but not limited to, an organic light-emitting diode (OLED), a mini LED, a micro LED, or a quantum dot LED. The tiled device may include a tiled display device or a tiled antenna device, for example but not limited thereto. It should be noted that the electronic device may be any arrangement or combination of the above, but is not limited thereto. In addition, the electronic device may have a shape of a rectangle, a circle, or a polygon, a shape with curved edges, or other suitable shapes. The electronic device may have peripheral systems such as a driving system, a control system, a light source system, or the like to support the display device, the antenna device, a wearable device (e.g., including Augmented Reality or Virtual Reality), a vehicle-mounted device (e.g., including an automobile windshield), or the tiled device.

Figure 3A:
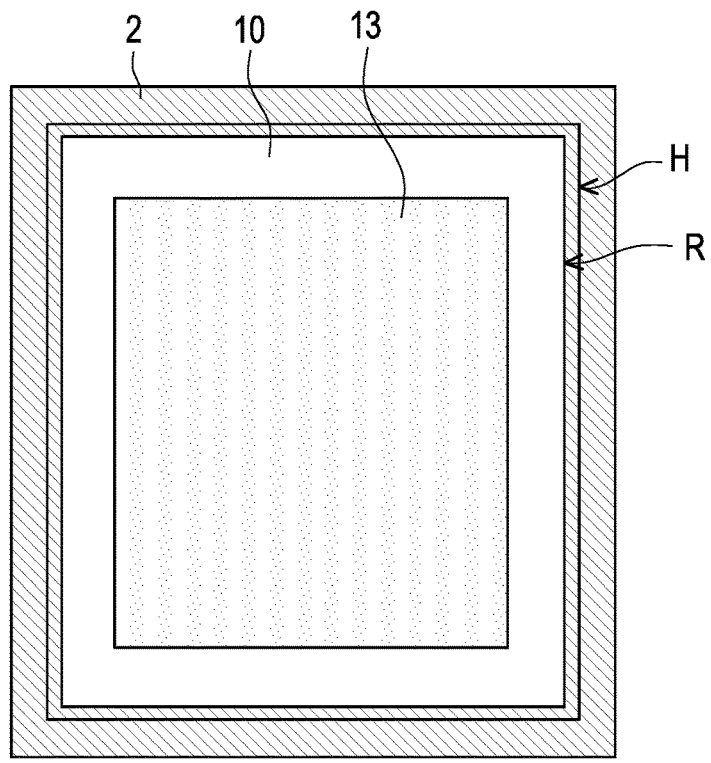
FIG. 3A and FIG. 3B are schematic top views of part of a manufacturing process of an electronic device according to an embodiment of the disclosure.
Figure 3B:
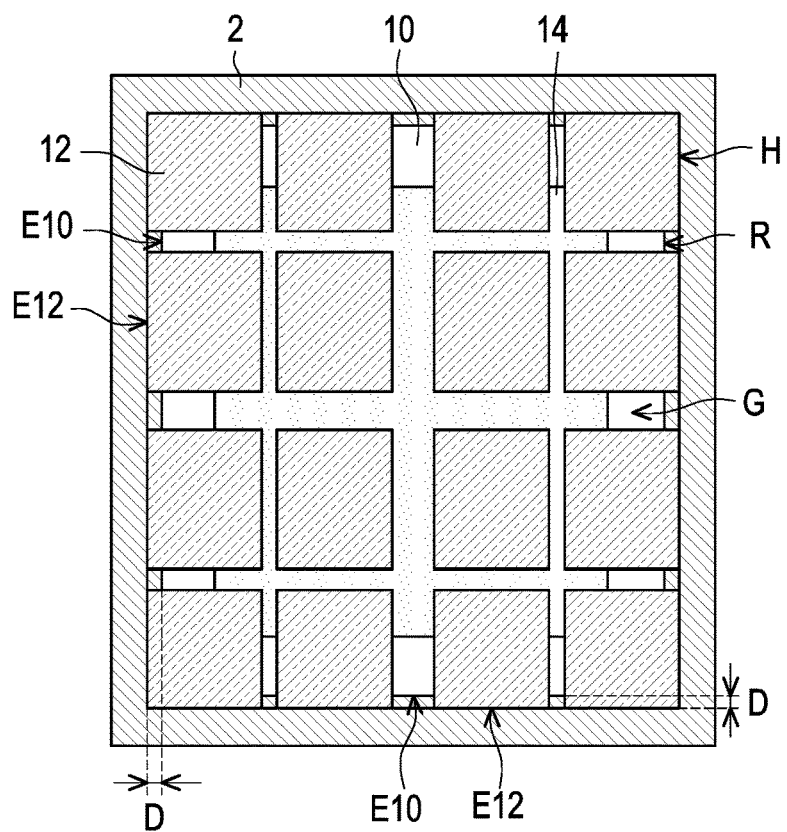
Figure 4A:
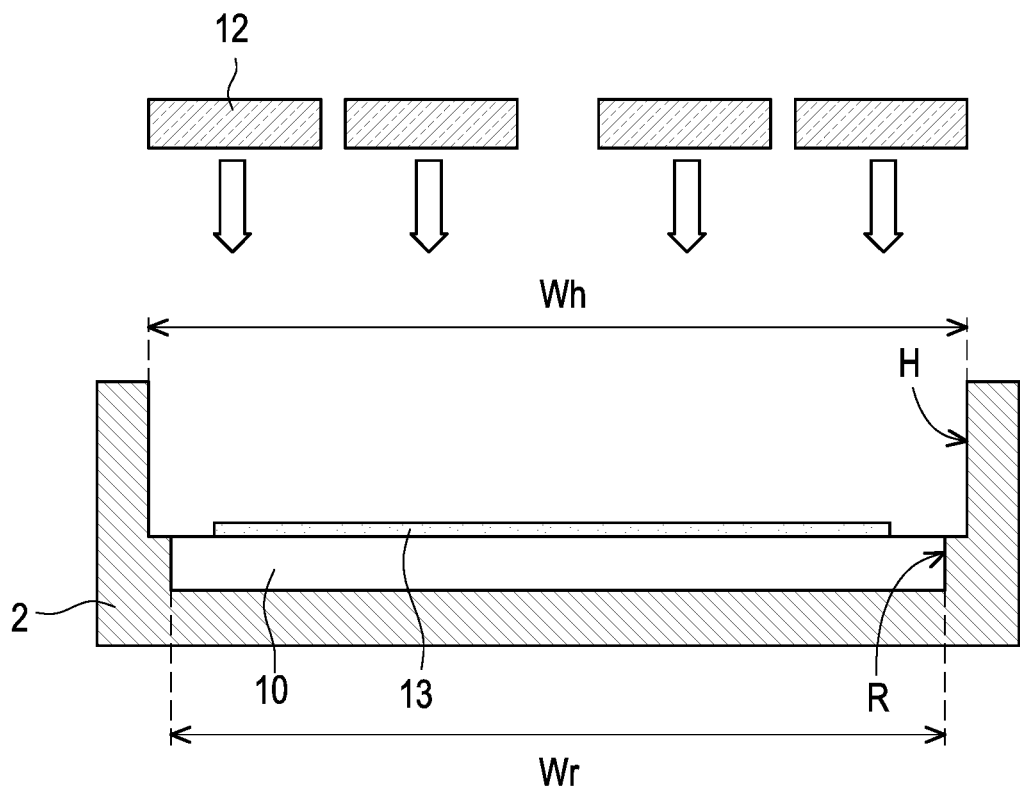
FIG. 4A and FIG. 4B are schematic cross-sectional views of the manufacturing process corresponding to FIG. 3A and FIG. 3B.
Figure 4B:
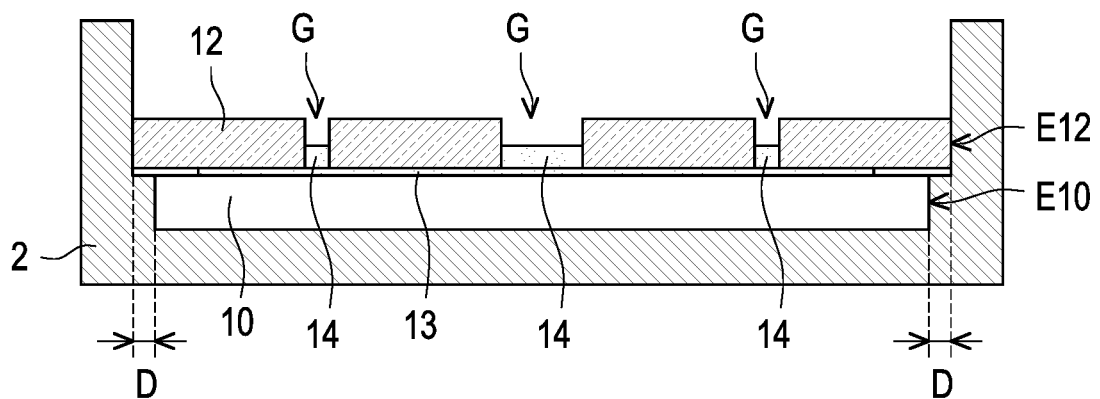
Figure 5:
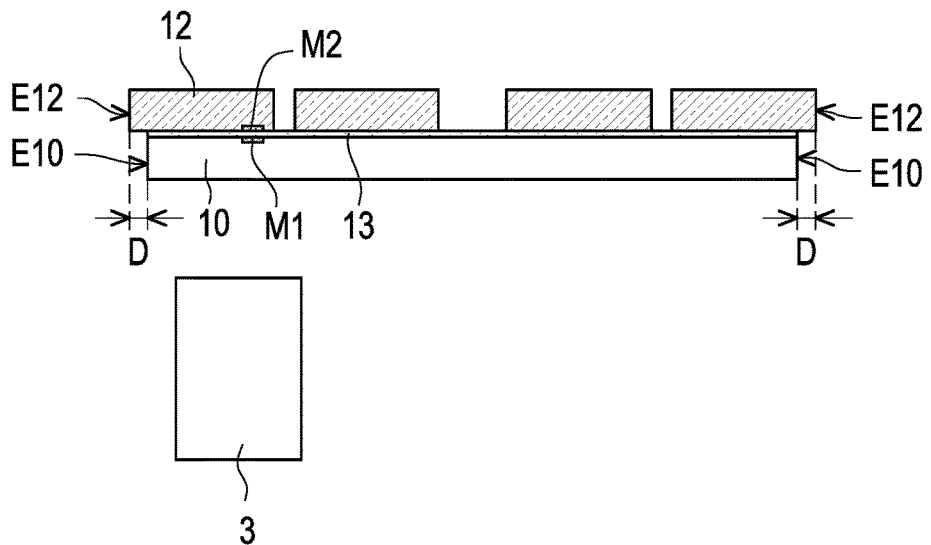
FIG. 5 is a schematic cross-sectional view of part of a manufacturing process of an electronic device according to another embodiment of the disclosure.
Figure 6A:
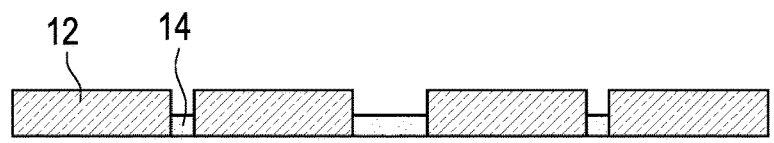
FIG. 6A and FIG. 6B are schematic cross-sectional views of part of a manufacturing process of an electronic device according to still another embodiment of the disclosure.
Figure 6B:
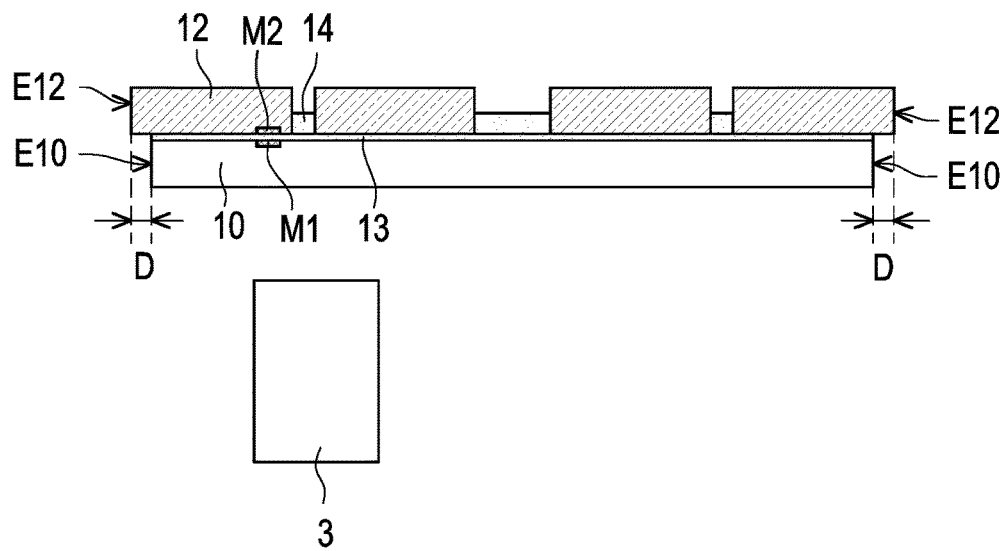

FIG. 1, FIG. 2, FIG. 7 to FIG. 9, FIG. 11, FIG. 13, FIG. 15, and FIG. 17 are schematic cross-sectional views of electronic devices according to some embodiments of the disclosure. FIG. 3A and FIG. 3B are schematic top views of part of a manufacturing process of an electronic device according to an embodiment of the disclosure. FIG. 4A and FIG. 4B are schematic cross-sectional views of the manufacturing process corresponding to FIG. 3A and FIG. 3B. FIG. 5 is a schematic cross-sectional view of part of a manufacturing process of an electronic device according to another embodiment of the disclosure. FIG. 6A and FIG. 6B are schematic cross-sectional views of part of a manufacturing process of an electronic device according to still another embodiment of the disclosure. FIG. 10, FIG. 12, FIG. 14, and FIG. 16 are schematic bottom views of electronic devices according to some embodiments of the disclosure.

With reference to FIG. 1, an electronic device 1 may include a circuit substrate 10, a plurality of electronic components 11, a plurality of carriers 12, and a bonding layer 13. The circuit substrate 10 includes the circuit layer 100. The plurality of electronic components 11 are disposed on the circuit substrate 10. The circuit layer 100 is electrically connected to at least one of the plurality of electronic components 11. The plurality of carriers 12 are disposed on the circuit substrate 10. The bonding layer 13 bonds the plurality of carriers 12 to the circuit substrate 10. At least one gap G is between the plurality of carriers 12. A width of the gap G is Wg. An average width of the plurality of carriers is Wa. A width of the circuit substrate is Wc. The electronic device satisfies: $Wa*2*10^{-4} < Wg < (Wc-Wa*2)$.

To be specific, the circuit substrate 10 may be configured to carry components and/or film layers or may be configured to electrically connect the plurality of electronic components 11 to other components (not shown in FIG. 1; for example, active components, passive components, signal sources, driving components, or other circuits). In some embodiments, as shown in FIG. 1, the circuit substrate 10 may include a circuit layer 100 and a substrate 102 configured to carrying the circuit layer 100. The circuit layer 100 may be a patterned conductive layer and may include a plurality of wires (not shown). The material of the circuit layer 100 may include a transparent conductive material or an opaque conductive material. The transparent conductive material may include a metal oxide, graphene, other suitable transparent conductive materials, or a combination thereof. The metal oxides may include an indium tin oxide, an indium zinc oxide, an aluminum tin oxide, an aluminum zinc oxide, an indium germanium zinc oxide, or other metal oxides. The opaque conductive material may include metals, alloys, or a combination thereof.

The substrate 102 may be a rigid substrate or may be a flexible substrate. The material of the substrate 102 includes glass, quartz, ceramic, sapphire, or plastic, for example but not limited thereto. The plastic may include polycarbonate (PC), polyimide (PI), polypropylene (PP), polyethylene terephthalate (PET), other suitable flexible materials, or a combination of the above materials, but not limited thereto. In addition, the transmittance of the substrate 102 is not limited, that is, the substrate 102 may be a transparent substrate, a semi-transparent substrate, or an opaque substrate.

In other embodiments, although not shown in FIG. 1, the circuit substrate 10 may be a circuit board, for example but not limited to a printed circuit board.

The plurality of electronic components 11 are, for example, disposed on the circuit layer 100 and electrically connected to corresponding wires (not shown) in the circuit layer 100. In some embodiments, the plurality of electronic components 11 may include a plurality of light-emitting elements, such as a plurality of light-emitting diodes (LEDs), a plurality of organic light-emitting diodes (OLEDs), a plurality of mini LEDs, a plurality of micro LEDs, or a plurality of quantum dot LEDs.

Depending on different requirements, the plurality of light-emitting elements may include a plurality of light-emitting elements of different colors or a plurality of light-emitting elements of a single color. For example, when the plurality of light-emitting elements serve as display pixels, the plurality of light-emitting elements may include a plurality of red light-emitting elements, a plurality of green light-emitting elements, and a plurality of blue light-emitting elements, but not limited thereto. In addition, when the plurality of light-emitting elements serve as light sources or backlight, the plurality of light-emitting elements may include a plurality of single-color light-emitting elements, for example but not limited to a plurality of white light-emitting elements or a plurality of blue light-emitting elements.

In other embodiments, the plurality of electronic components 11 may also include other types of electronic components, such as a passive component, an active component, an optical component, or a combination thereof.

The plurality of carriers 12 are disposed on the circuit substrate 10 through the bonding layer 13. In some embodiments, as shown in FIG. 1, the plurality of electronic components 11 and the plurality of carriers 12 are respectively located on opposite sides (e.g., upper and lower sides) of the circuit substrate 10, but not limited thereto. In other embodiments, although not shown in FIG. 1, the plurality of electronic components 11 and the plurality of carriers 12 may be located on the same side of the circuit substrate 10.

Depending on different requirements, the plurality of carriers 12 may include a plurality of heat-conducting components, a plurality of insulating components, a plurality of conductive components, a plurality of semiconductor components, a plurality of control components, a plurality of piezoelectric components, a plurality of magnetic components, a plurality of electrostatic protection components, a plurality of signal shielding components, a plurality of signal transmission components, a plurality of thermoelectric components, or a combination thereof, but not limited thereto.

The material of the plurality of heat-conducting components may include silver, copper, gold, aluminum, tungsten, ceramic, other heat-dissipating materials, or a combination thereof. The material of the plurality of insulating components may include fiberglass (e.g., FR4), glue, glass, ceramic, other insulating materials, or a combination thereof. The material of the plurality of conductive components may include metals, for example, aluminum, copper, iron, other metallic materials, or a combination thereof. The plurality of semiconductor components may include an integrated circuit, a packaging component, a refrigeration chip, other semiconductor components, or a combination thereof. The plurality of control components may include a driving element, a switch element, other control components, or a combination thereof. The material of the plurality of piezoelectric components may include a piezoelectric single crystal, a piezoelectric polycrystal (piezoelectric ceramic), a piezoelectric polymer, a piezoelectric composite material, or a combination thereof. The material of the plurality of magnetic components may include a metal and alloy magnetic material, a ferrite magnetic material, or a combination thereof. The plurality of electrostatic protection components may include a varistor, a Zener diode, a multi-layer varistor (MLV), a polymer suppresser, a transient voltage suppresser (TVS), other electrostatic protection components, or a combination thereof. The plurality of signal shielding components may include an electrical signal shielding component, an optical signal (e.g., electromagnetic wave) shielding component, or a combination thereof. The plurality of signal transmission components may include a signal transmitting component, a signal receiving component, or a combination thereof, for example but not limited to an antenna. The material of the plurality of thermoelectric components may include a thermoelectric material, such as germanium (Ge), antimony (Sb), tellurium (Te), bismuth telluride, lead telluride, a silicon germanium alloy, a silicon germanium compound, antimony telluride, tin telluride, a copper nickel alloy, iron silicon, other thermoelectric materials, or a combination thereof.

In some embodiments, the bonding layer 13 may serve for adhering/attaching without having a conductive effect. For example, the bonding layer 13 may include an optical clear adhesive (OCA), an optical clear resin (OCR), a double-sided adhesive, or an elastic adhesive, but not limited thereto. In other embodiments, although not shown in FIG. 1, when the plurality of electronic components 11 and the plurality of carriers 12 are located on the same side of the circuit substrate 10, the bonding layer 13 may further have a conductive effect. For example, the bonding layer 13 may include a conductive member, for example but not limited to a conductive bump (e.g., a solder ball), a conductive adhesive, or an anisotropic conductive film (ACF).

The plurality of carriers 12 are separated from each other, and a gap G is between any two adjacent carriers 12. FIG. 1 schematically shows four carriers 12 and three gaps G, but it should be understood that the electronic device 1 may include more or fewer carriers 12 and more or fewer gaps G. In addition, dimensions (e.g., a length, a width, or a thickness) of the plurality of carriers 12 may be the same or different, and dimensions (e.g., the width Wg) of the plurality of gaps G may be the same or different.

In the disclosure, the width Wg of the gap G refers to the minimum lateral distance between any two adjacent carriers 12 in the cross-sectional image of the electronic device 1; the average width Wa of the plurality of carriers 12 refers to the average of the maximum widths of all carriers 12 in the lateral direction in the cross-sectional image of the electronic device 1 (e.g., the sum of a width W1, a width W2, a width W3, and a width W4 in FIG. 1 divided by four); the width Wc of the circuit substrate 10 refers to the maximum width of the circuit substrate 10 in the lateral direction in the cross-sectional image of the electronic device 1. As a result, the relation $Wa*2*10^{-4}<Wg<(Wc-Wa*2)$ refers to that the width Wg of each gap G is greater than the average width Wa of the plurality of carriers 12 multiplied by two multiplied by ten to the power of negative four, and the width Wg of each gap G is less than the width Wc of the circuit substrate minus twice the average width Wa.

Compared with bonding a single large carrier to the circuit substrate, bonding the plurality of carriers 12 separated from each other to the circuit substrate 10 may help dissipate heat or improve the evenness of heat distribution, to reduce impact of heat on the performance of the electronic components 11. For example, when the electronic components 11 include light-emitting elements and the plurality of carriers 12 include a plurality of heat-conducting components, the plurality of carriers 12 separated from each other help discharge heat generated by operation of the plurality of electronic components 11 located in different regions, to improve the heat dissipation effect of different regions or improve the evenness of heat distribution is improved. Accordingly, it may reduce the negative impact (e.g., brightness reduction or color shift) of the thermal effect on the plurality of electronic components 11, and help improve evenness of light emission or evenness of chromaticity.

In addition, compared with bonding a single large carrier to the circuit substrate, bonding the plurality of carriers 12 separated from each other to the circuit substrate 10 may reduce the bonding area between the carriers 12 and the circuit substrate 10, and help reduce thermal stress and its range of action. Further, combining with the gap G to dissipate heat and modulate the width variation caused by temperature changes (e.g., the width Wg of the gap G decreases as the temperature increases, and increases as the temperature decreases) may mitigate deformation or warpage caused by thermal stress, and help improve the overall flatness, reliability (e.g., adhesion between the carriers 12 and the circuit substrate 10 and/or adhesion between the electronic components 11 and the circuit substrate 10), or yield. Correspondingly, the thermal expansion coefficient of the carriers 12 may have a relatively broad selection range, and the material of the carriers 12 has a relatively wide selection.

In addition, when the plurality of carriers 12 are bonded to the circuit substrate 10, the tolerance of the carriers 12 in the length or width direction may be compensated by the gap G, so the design of the carriers 12 may be relatively flexible and relatively easy in terms of manufacturing. In some embodiments, based on the considerations of manufacturing process, design, application, cost, or the like, the electronic device 1 may further satisfy: $Wc*10^{-6}<Wa<Wc$.

Furthermore, when the carriers 12 have a non-flat bonding surface or the thicknesses of the plurality of carriers 12 are inconsistent, the gap between the carriers 12 and the circuit substrate may be filled by the bonding layer 13, to make the bottom surfaces of the plurality of carriers 12 flush or improve the flatness.

In some embodiments, as shown in FIG. 1, it is also possible to protect the circuit substrate 10 (e.g., anti-scratch or anti-collision) by an edge E12 of the plurality of carriers 12 protruding by a distance D from a lateral side E10 of the circuit substrate 10, but not limited thereto.

Figure 2:
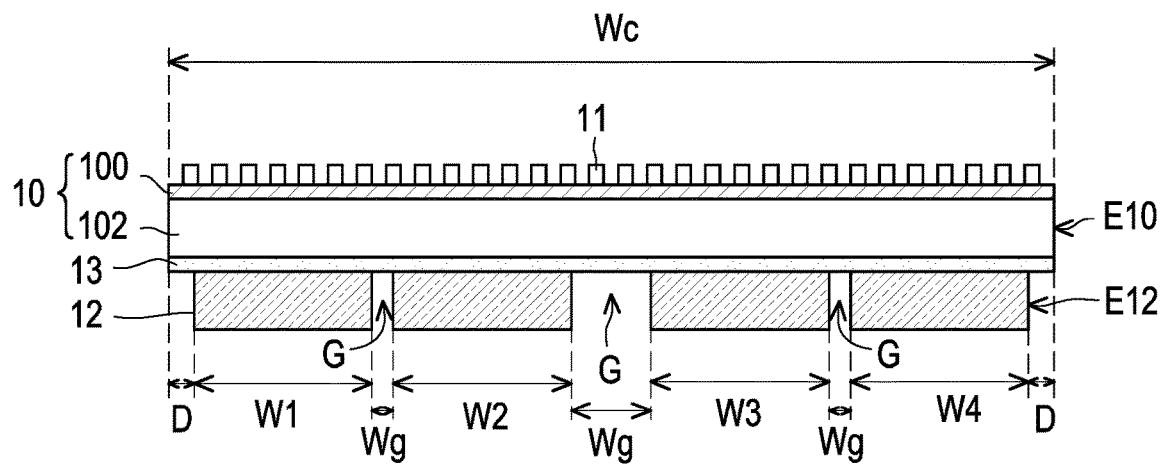

In other embodiments, as shown in an electronic device 1A of FIG. 2, the edge E12 of the plurality of carriers 12 may be recessed by the distance D from the lateral side E10 of the circuit substrate 10. Based on the considerations of manufacturing process, design, application, cost, or the like, the electronic device 1 or the electronic device 1A may further satisfy: $Wc*10^{-9}<D<Wa$. In any embodiment of the disclosure, the edge E12 of the plurality of carriers 12 may protrude out of the circuit substrate 10 or be recessed within the circuit substrate 10, which will not be repeatedly described below.

With reference to FIG. 3A to FIG. 4B, a manufacturing method of an electronic device may include providing the circuit substrate 10; and fixing the plurality of carriers 12 to the circuit substrate 10 by the bonding layer 13. Reference may be made to the above for details of the circuit substrate 10, the bonding layer 13, and the carriers 12, which are not repeatedly described here.

In some embodiments, the circuit substrate 10 and the plurality of carriers 12 may be aligned by a packaging jig 2. As shown in FIG. 3A and FIG. 4A, the packaging jig 2 may include a groove R for accommodating the circuit substrate 10 and a hole H for limiting or aligning. For example, the hole H is in communication with the groove R, and for example, a width Wh of the hole H is greater than a width Wr of the groove R, such that after the plurality of carriers 12 are bonded to the circuit substrate 10 by the bonding layer 13, the edge E12 of the plurality of carriers 12 protrudes by the distance D from the lateral side E10 of the circuit substrate 10.

To be specific, as shown in FIG. 3A and FIG. 4A, the circuit substrate 10 may first be disposed in the groove R of the packaging jig 2, and then the bonding layer 13 (e.g., an adhesive body) is formed (e.g., coated) on the circuit substrate 10 or the plurality of carriers 12. If the bonding layer 13 is formed on the circuit substrate 10, the disposing/coating area of the bonding layer 13 may be less than or equal to the area of the circuit substrate 10. If the bonding layer 13 is formed on the plurality of carriers 12, the disposing/coating area of the bonding layer 13 may be less than or equal to the area of the carriers 12.

Next, as shown in FIG. 3B and FIG. 4B, the plurality of carriers 12 are placed in the hole H and aligned with the circuit substrate 10. Then, the adhesive body may be cured through a curing process (e.g., light curing, heat curing, or the like).

In some embodiments, the manufacturing method of an electronic device may further include forming another bonding layer (e.g., a bonding layer 14) in the gap G to enhance stability. The material of the bonding layer 14 may be selected from the above-mentioned materials of the bonding layer 13, and the bonding layer 14 and the bonding layer 13 may have the same or different materials. In any embodiment of the disclosure, the electronic device may further include the bonding layer 14, which will not be repeatedly described below.

In other embodiments, as shown in FIG. 5, the circuit substrate 10 and the plurality of carriers 12 may be positioned by an alignment pattern, and the packaging jig may be omitted. For example, the circuit substrate 10 may have an alignment pattern M1. The plurality of carriers 12 may be adsorbed on the same suction cup (not shown), and at least one carrier 12 may have an alignment pattern M2. The alignment pattern M1 and the alignment pattern M2 may have the same or a complementary shape. In addition, the bonding layer 13 (e.g., an adhesive body) may first be formed (e.g., coated) on the circuit substrate 10 or the plurality of carriers 12, and then the plurality of carriers 12 are disposed on the circuit substrate 10. Before the curing process, an image capturing component 3 may first be utilized to observe whether the alignment pattern M1 is aligned with the alignment pattern M2. If the alignment pattern M1 is not aligned with the alignment pattern M2, the positions of the plurality of carriers 12 are adjusted. If the alignment pattern M1 is aligned with the alignment pattern M2, the curing process may be continued. The image capturing component 3 may include a charge coupled device (CCD), but not limited thereto.

In some embodiments, although not shown in FIG. 5, the image capturing component 3 or other image capturing components may also be utilized to observe whether the distance D between the edge E12 of the carriers 12 and the lateral side E10 of the circuit substrate 10 satisfies $Wc*10^{-9} < D < Wa$.

In some embodiments, as shown in FIG. 6A and FIG. 6B, the plurality of carriers 12 may first be fixed together by the bonding layer 14, and then the bonding layer 13 is formed on the circuit substrate 10 or the plurality of carriers 12. Before the curing process, the image capturing component 3 may first be utilized to observe whether the alignment pattern M1 is aligned with the alignment pattern M2. If the alignment pattern M1 is not aligned with the alignment pattern M2, the positions of the plurality of carriers 12 are adjusted. If the alignment pattern M1 is aligned with the alignment pattern M2, the curing process is continued.

In some embodiments, although not shown in FIG. 6A and FIG. 6B, the image capturing component 3 or other image capturing components may also be utilized to observe whether the distance D between the edge E12 of the carriers 12 and the lateral side E10 of the circuit substrate satisfies $Wc*10^{-9} < D < Wa$.

Figure 7:
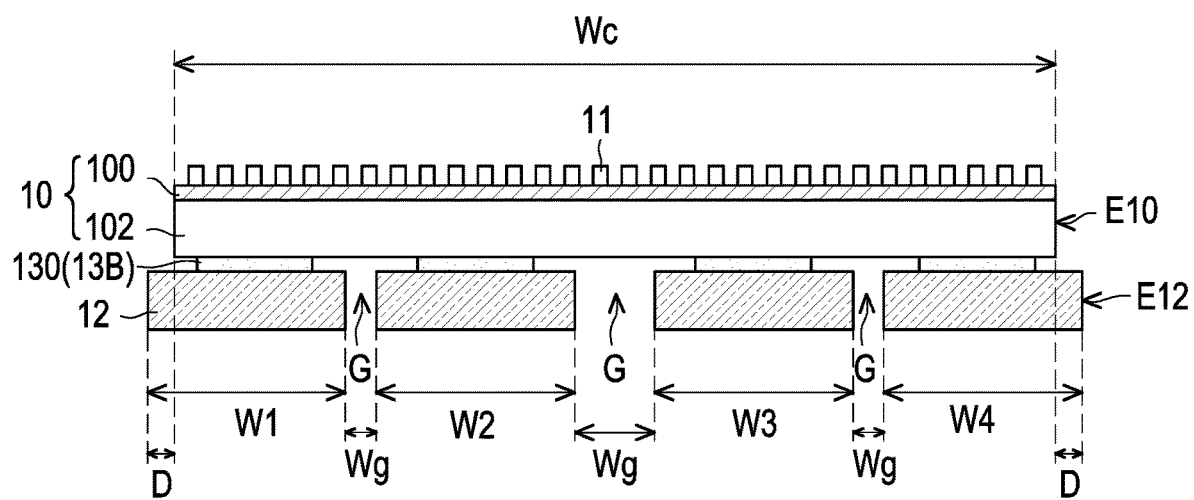

With reference to FIG. 7, the main difference between an electronic device 1B and the electronic device 1 in FIG. 1 is that a bonding layer 13B is a patterned bonding layer and includes a plurality of bonding patterns 130. The plurality of carriers 12 are bonded to the circuit substrate respectively by the plurality of bonding patterns 130, for example.

Figure 8:
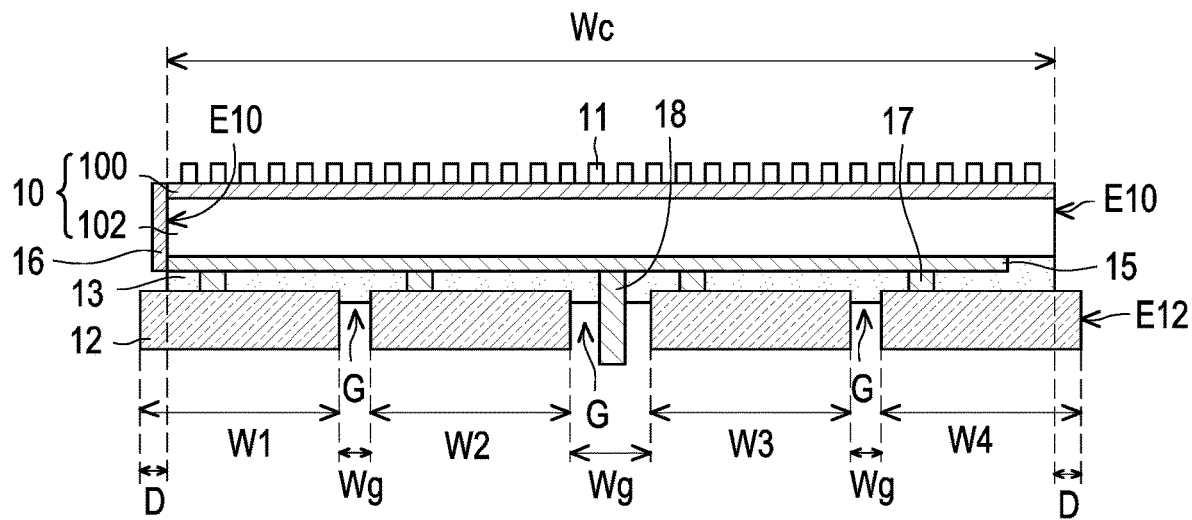

With reference to FIG. 8, the main differences between an electronic device 1C and the electronic device 1 in FIG. 1 are described as follows. The electronic device 1C further includes a trace layer 15 and a wire 16. The trace layer 15 is disposed between the circuit layer 100 and the bonding layer 13. The wire 16 is disposed on the lateral side E10 of the circuit substrate 10 and electrically connects the circuit layer 100 and the trace layer 15.

To be specific, the trace layer 15 is, for example, a patterned conductive layer and may include a plurality of traces (not shown). Reference may be made to the material of the circuit layer 100 for the material of the trace layer 15, which is not repeatedly described here. The wire 16 is formed on the lateral side E10 of the circuit substrate 10 by printing or coating, for example but not limited thereto. The material of the wire 16 may include a conductive adhesive body, a conductive paste, a conductive adhesive tape, or other conductive materials. FIG. 8 schematically shows one wire 16, but it should be understood that the electronic device 1C may include a plurality of wires 16.

In some embodiments, the electronic device 1C may further include a plurality of conductive members 17 and a connection circuit 18. Each carrier 12 may be electrically connected to a corresponding trace (not shown) in the trace layer 15 through one conductive member 17. The conductive members 17 may include a conductive bump (e.g., a solder ball), a conductive adhesive, or an anisotropic conductive film, but not limited thereto. The connection circuit 18 is electrically connected to the trace layer 15 to transmit external signals or electric power. FIG. 8 schematically shows one connection circuit 18, but it should be understood that the electronic device 1C may include a plurality of connection circuits 18. Through the above design, each carrier 12 may be controlled independently; or the plurality of carriers 12 may be controlled partitionally. Signals between the plurality of carriers 12 may be in communication with each other through the trace layer 15. In addition, each electronic component 11 may also be individually driven by the connection circuit 18, the trace layer 15, the wire 16, and the circuit layer 100. In other embodiments, although not shown, the electronic device 1C may not include the plurality of conductive members 17.

Figure 9:
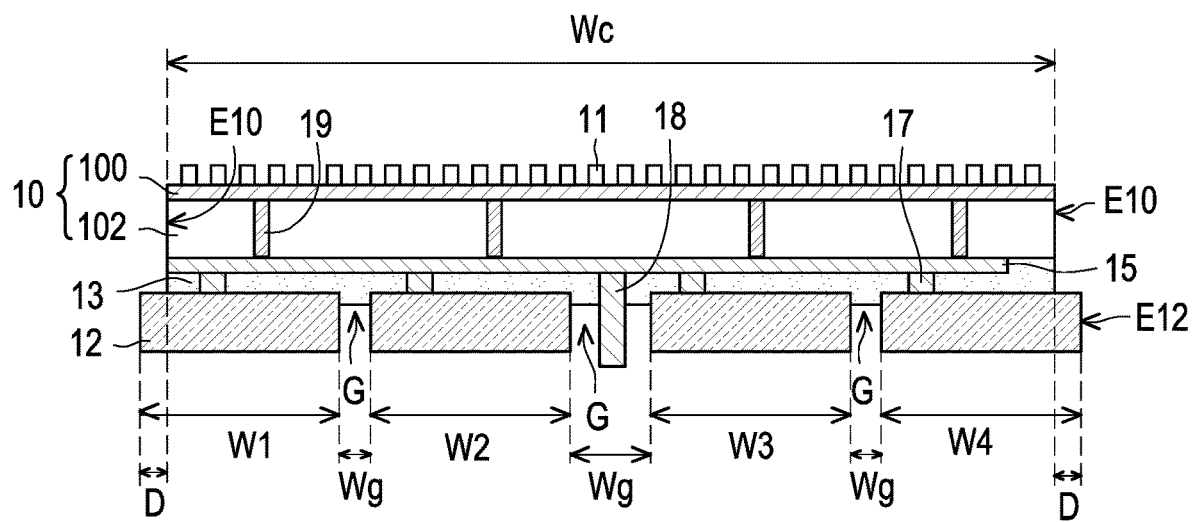

With reference to FIG. 9, the main differences between an electronic device 1D and the electronic device 1C in FIG. 8 are described as follows. The electronic device 1D does not include the wire 16, and the electronic device 1D further includes a conductive via 19. The conductive via 19 is disposed in the circuit substrate 10 and electrically connects the circuit layer 100 and the trace layer 15. FIG. 9 schematically shows four conductive vias 19, but it should be understood that the electronic device 1C may include more or fewer conductive vias 19. Through the above design, each carrier 12 may be controlled independently; or the plurality of carriers 12 may be controlled partitionally. Signals between the plurality of carriers 12 may be in communication with each other through the trace layer 15. In addition, each electronic component 11 may be individually driven by the connection circuit 18, the trace layer 15, the conductive via 19, and the circuit layer 100. In other embodiments, although not shown, the electronic device 1C may not include the plurality of conductive members 17.

With reference to FIG. 10 to FIG. 13, in an electronic device 1E and an electronic device 1F, the plurality of carriers 12 are, for example, a plurality of heat-conducting components, for example but not limited to a plurality of aluminum plates. As the area and/or thickness of the heat-conducting components increases, the speed of heat dissipation increases. In the case of uneven heat distribution in the circuit substrate 10, the temperature may be regulated by modulating the area and/or thickness of the plurality of carriers 12 to achieve overall heat evenness.

Figure 10:
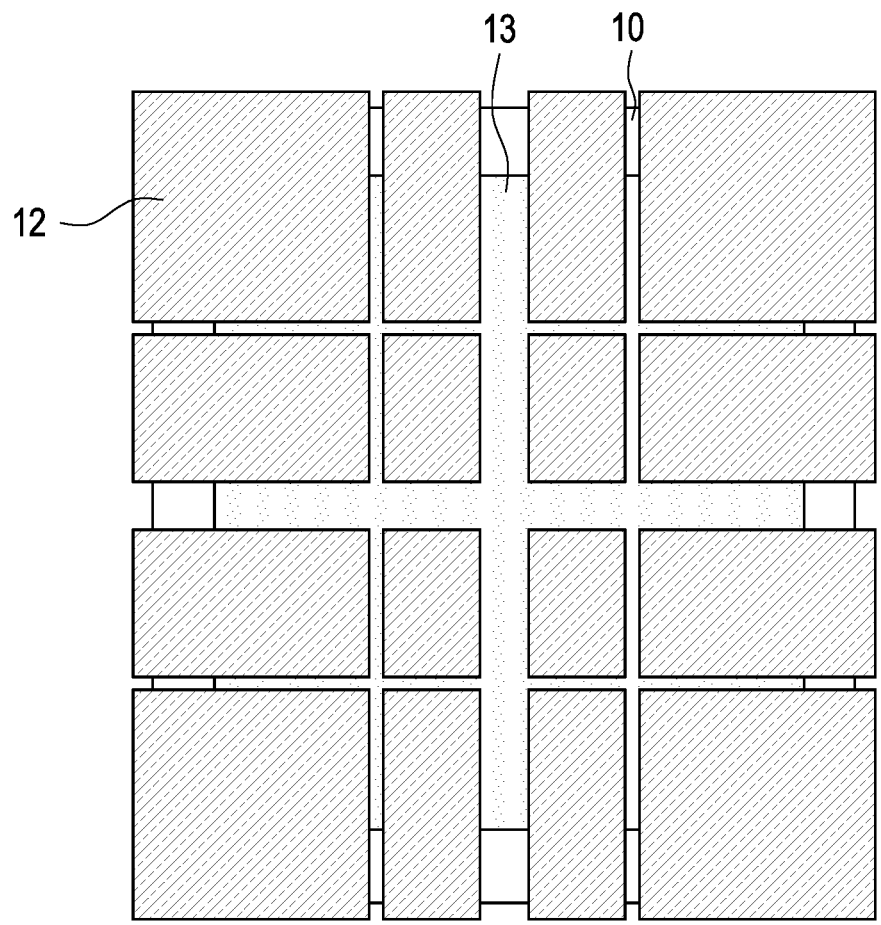
FIG. 10, FIG. 12, FIG. 14, and FIG. 16 are schematic bottom views of electronic devices according to some embodiments of the disclosure.
Figure 11:
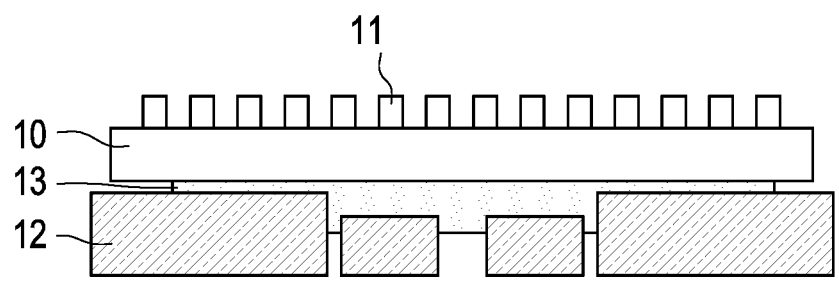

For example, if the temperature distribution of the circuit substrate 10 gradually decreases from the edge to the center, a carrier 12 closer to the edge may be thicker and/or have a larger area, and a carrier 12 closer to the center may be thinner and/or have a smaller area, as shown in FIG. 10 and FIG. 11.

Figure 12:
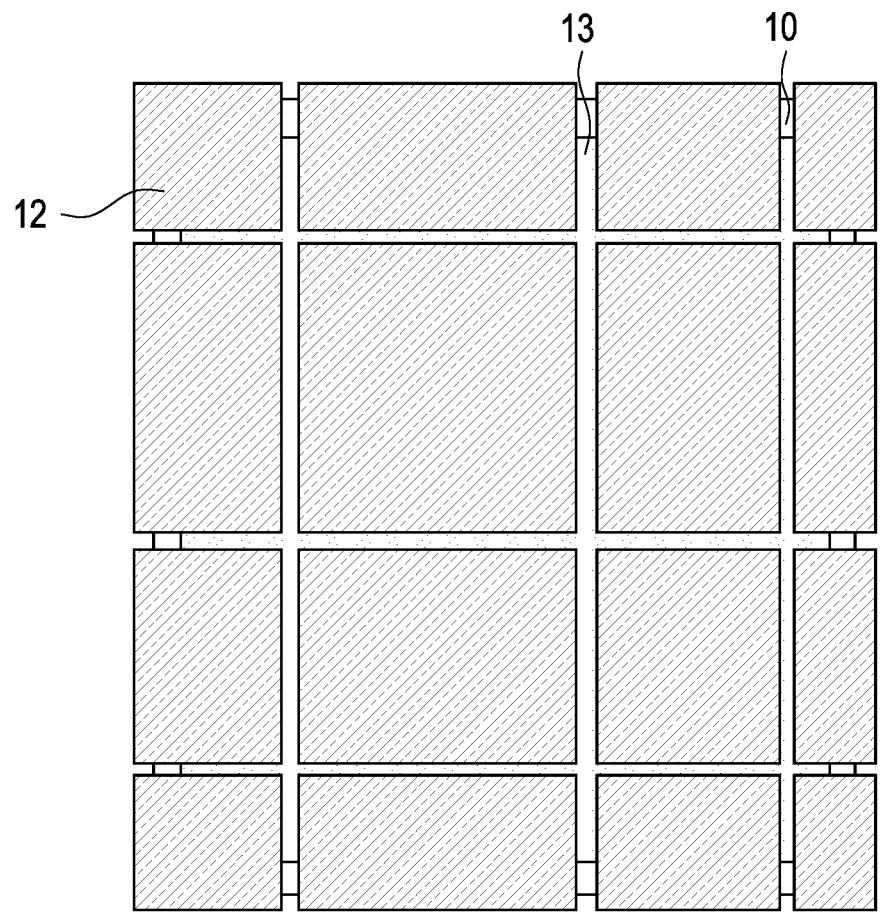
Figure 13:
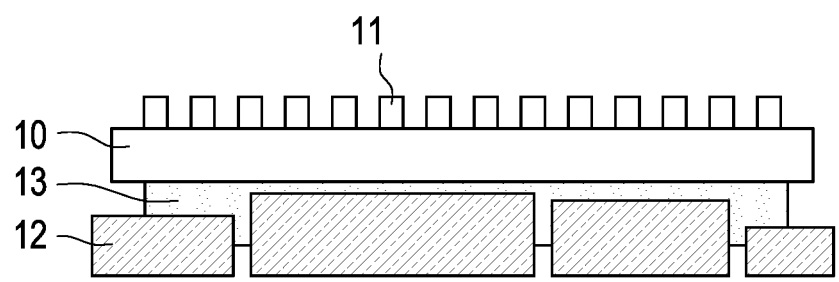

If the temperature distribution of the circuit substrate 10 gradually decreases from a region between the edge and the center, a carrier 12 closer to the region may be thicker and/or have a larger area, and a carrier 12 farther from the region may be thinner and/or have a smaller area, as shown in FIG. 12 and FIG. 13.

Regionally designing the area and/or thickness of the carriers 12 according to the application of the electronic device or distribution of the heat source may achieve overall heat evenness. In addition, when the thicknesses of the plurality of carriers 12 are inconsistent, the gap between the carriers 12 and the circuit substrate 10 may be filled by the bonding layer 13, to make the bottom surfaces of the plurality of carriers 12 flush or improve the flatness.

Although the bottom-view shape of the carriers 12 in the embodiments above is shown as a quadrangle, the bottom-view shape of the plurality of carriers 12 may vary depending on the requirements, and is not limited to a quadrangle. In other embodiments, although not shown, the bottom-view shape of the carriers 12 may be other polygons, concentric circles (e.g., as an antenna), irregular shapes, or a combination thereof. Any embodiment of the disclosure may have the same changes, and will not be repeatedly described below.

Figure 14:
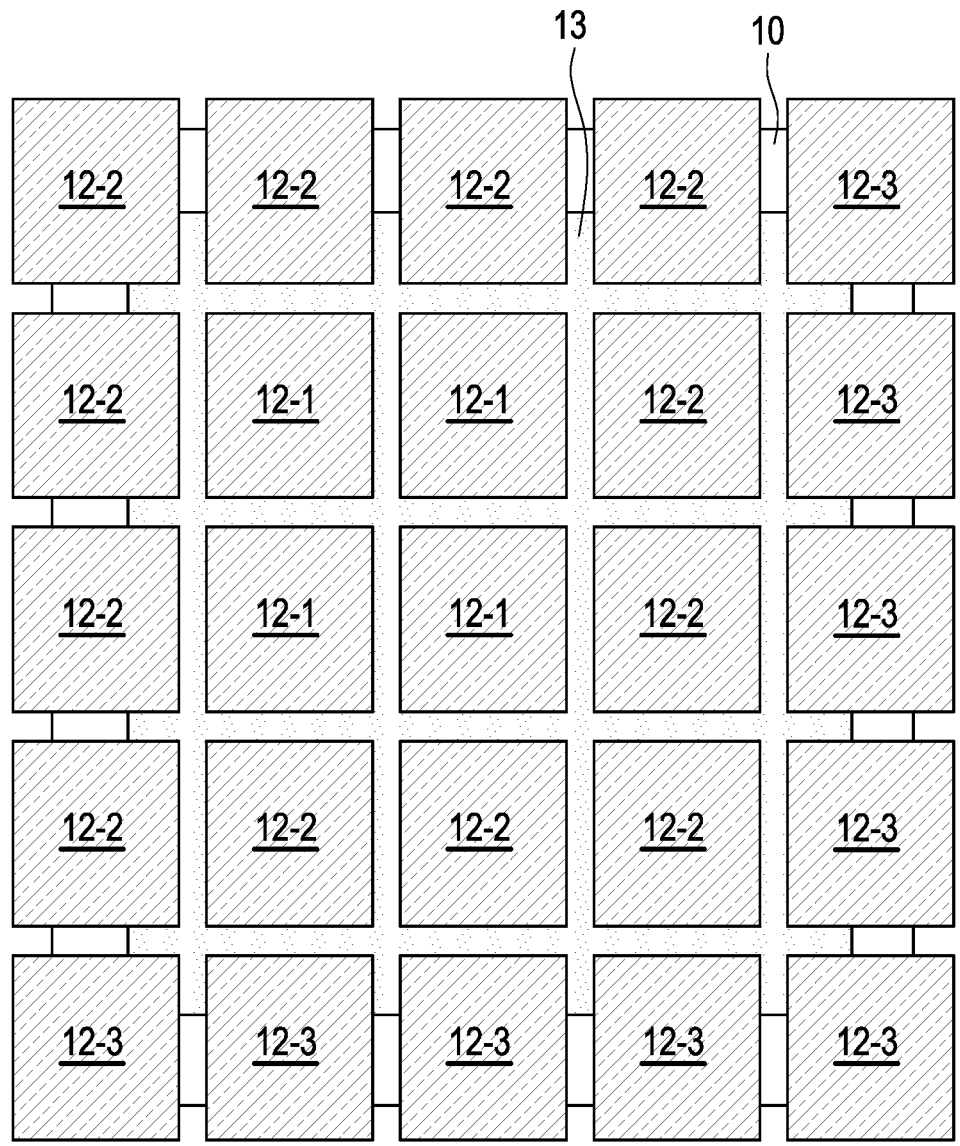

In addition to the temperature regulation described above, active-mode temperature regulation may also be performed by supplying different electrical signals/current signals to different carriers 12. With reference to FIG. 14, in an electronic device 1G, the plurality of carriers (e.g., a plurality of carriers 12-1, a plurality of carriers 12-2, and a plurality of carriers 12-3) are a plurality of refrigeration chips, for example but not limited thereto. Although not shown, there are an N-type semiconductor and a P-type semiconductor in the refrigeration chips. When the current flows from the N-type semiconductor to the P-type semiconductor, the refrigeration chips absorb heat and becomes a cold side. In addition, when the current flows from the P-type semiconductor to the N-type semiconductor, the refrigeration chips release heat and becomes a hot side. As a result, the evenness of heat distribution may be improved by controlling the direction and magnitude of the current supplied to the carriers.

For example, if the heat source is located at a position near the upper left corner of the center of FIG. 14, by electronic control, the plurality of carriers 12-1 may be made cooler than the plurality of carriers 12-2, and the plurality of carriers 12-2 may be made cooler than the plurality of carriers 12-3, to improve the evenness of heat distribution. By utilizing the active-mode temperature regulation, the temperature of the plurality of carriers may be regulated at any time according to the position of the heat source.

Under the configuration of active-mode temperature regulation, the plurality of carriers may have the same area and/or the same thickness, but not limited thereto. Depending on different requirements, the plurality of carriers may have different areas and/or different thicknesses.

Under the configuration of FIG. 14, the plurality of carriers may also be a plurality of thermoelectric components. The thermoelectric component may utilize the thermoelectric effect for direct conversion of temperature difference and voltage. The thermoelectric component produces a voltage when there is a temperature difference across its two ends, and the thermoelectric component produces a temperature difference when there is a voltage difference across its two ends. As a result, the thermoelectric component may be utilized to generate electricity, cool the circuit substrate 10, or heat the circuit substrate 10.

Taking generating electricity as an example, if the plurality of carriers 12-1 have the largest temperature difference, the plurality of carriers 12-2 have the second largest temperature difference, and the plurality of carriers 12-3 have the smallest temperature difference, then the plurality of carriers 12-1 generate more electric energy than the plurality of carriers 12-2 do, and the plurality of carriers 12-2 generate more electric energy than the plurality of carriers 12-3 do. Taking cooling the circuit substrate 10 as an example, if the heat source is located at a position near the upper left corner of the center of FIG. 14, then by applying different voltages to the plurality of carriers 12-1, the plurality of carriers 12-2, and the plurality of carriers 12-3, the plurality of carriers 12-1 may be made cooler than the plurality of carriers 12-2, and the plurality of carriers 12-2 may be made cooler than the plurality of carriers 12-3, to improve the evenness of heat distribution.

Figure 15:
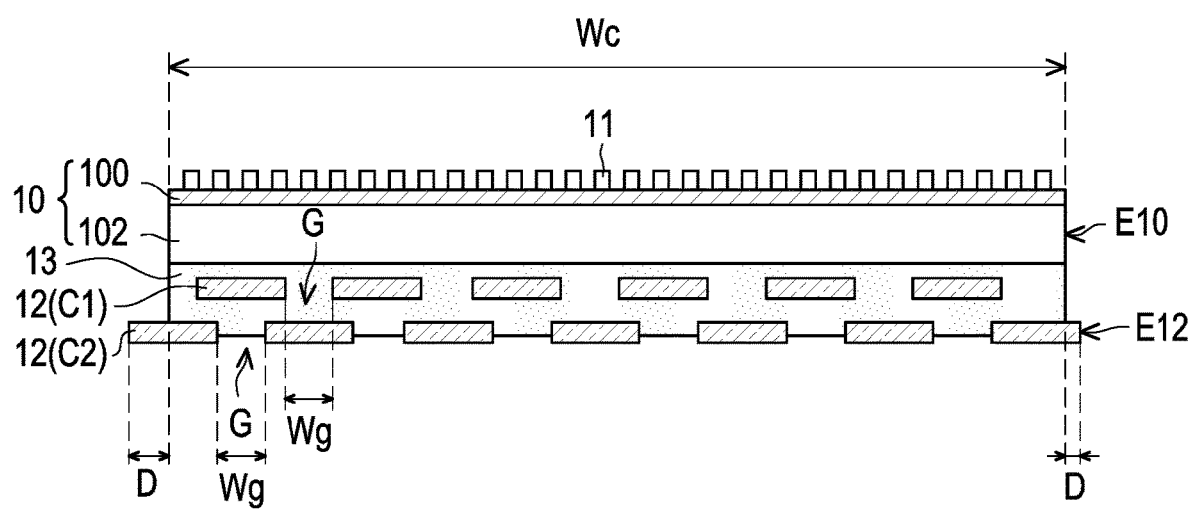

With reference to FIG. 15, the main difference between an electronic device 1H and the electronic device 1 in FIG. 1 is that the electronic device 1H includes two conductor layers (e.g., a conductor layer C1 and a conductor layer C2). The conductor layer C1 is located between the conductor layer C2 and the circuit substrate 10. Each conductor layer includes a plurality of conductors 12, and the plurality of conductors 12 in the two conductor layers are arranged staggeredly in the lateral direction. Depending on different requirements, the bottom-view shape of the plurality of conductors 12 may be a quadrangle, other polygons, concentric circles (e.g., as an antenna), irregular shapes, or a combination thereof. Through the design of the plurality of conductor layers, design flexibility may be enhanced or more operations/functions may be provided. For example, the plurality of conductors 12 in different conductor layers may have different purposes. For example, the plurality of conductors 12 in the conductor layer C1 may serve for signal transmission, heat dissipation, signal control, or other purposes, while the plurality of conductors 12 in the conductor layer C2 may serve for electrostatic protection, signal shielding, or other purposes.

Figure 16:
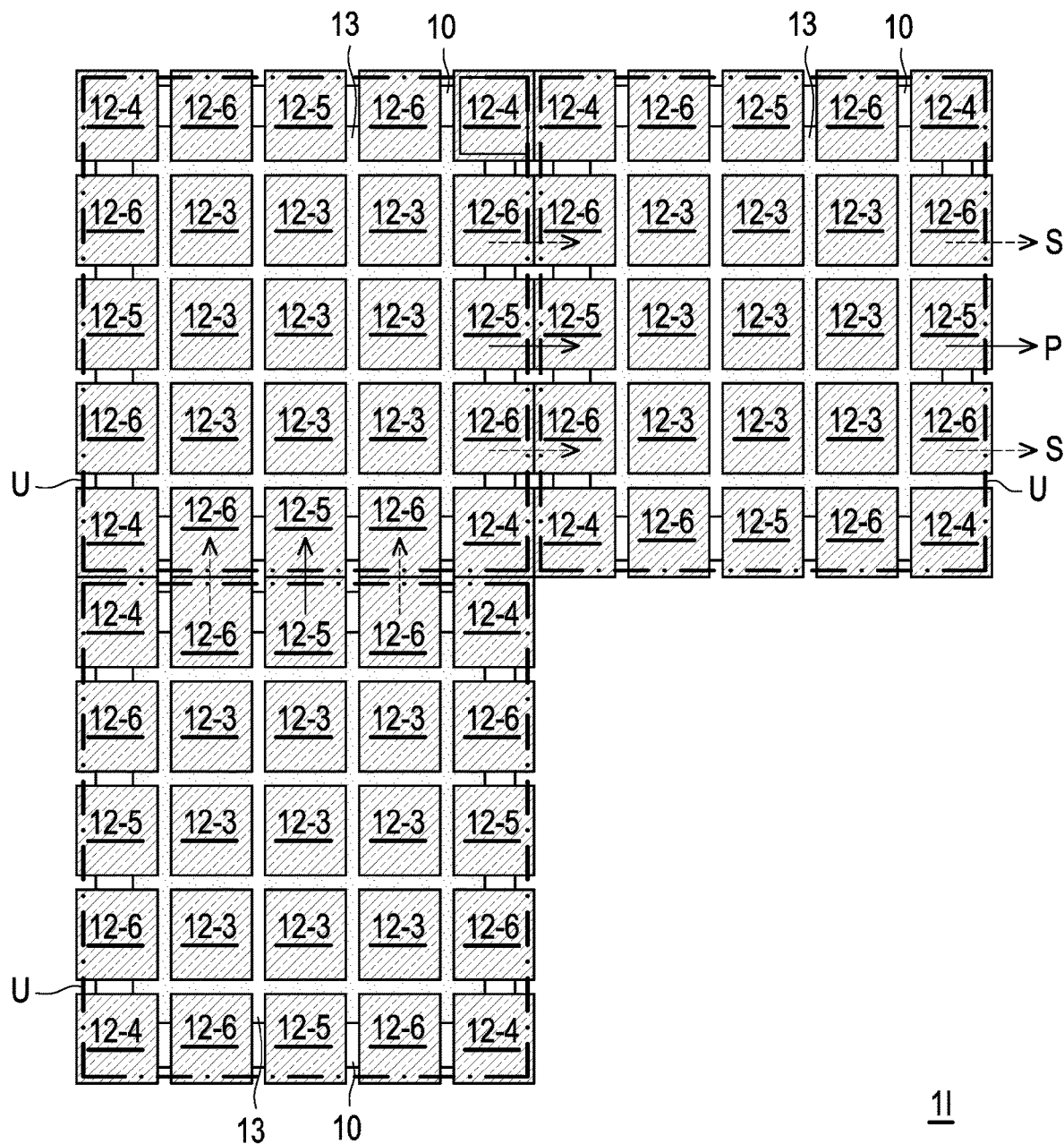

With reference to FIG. 16, the main difference between an electronic device 1I and the electronic device 1G in FIG. 14 is that the electronic device 1I includes a plurality of units U (three schematically shown). The plurality of units U are tiled together, and each unit U includes a circuit substrate 10, a plurality of electronic components 11 (see FIG. 1), a plurality of carriers (e.g., a plurality of carriers 12-3, a plurality of carriers 12-4, a plurality of carriers 12-5, and a plurality of carriers 12-6), and a bonding layer 13.

In each unit U, the plurality of carriers 12-3 are, for example, a plurality of heat-conducting components, the plurality of carriers 12-4 are, for example, a plurality of magnetic components, and the plurality of carriers 12-5 and the plurality of carriers 12-6 are, for example, a plurality of conductive components. The plurality of heat-conducting components may include an active-type heat-conducting component, a passive-type heat-conducting component (adjusting the heat dissipation rate by changing the area or thickness), or a combination thereof. The plurality of magnetic components may include a plurality of N-type magnets and a plurality of S-type magnets. For example, in each unit U, the two magnetic components at the upper left corner and the lower right corner may be N-type magnets (or S-type magnets), and the two magnetic components at the upper right corner and the lower left corner may be S-type magnets (or N-type magnets). In this way, the plurality of units U may be closely tiled together by magnetic attraction. The plurality of carriers 12-5 may be configured to transmit an electrical signal S, and the plurality of carriers 12-6 may transmit electric power P. When two adjacent units U are closely tiled together by magnetic attraction, two carriers 12-5 and/or two carriers 12-6 that correspond in the two units U may also be reliably electrically connected, so it is not required to dispose additional connection wires to transmit the electrical signal S or the electric power P.

Figure 17:
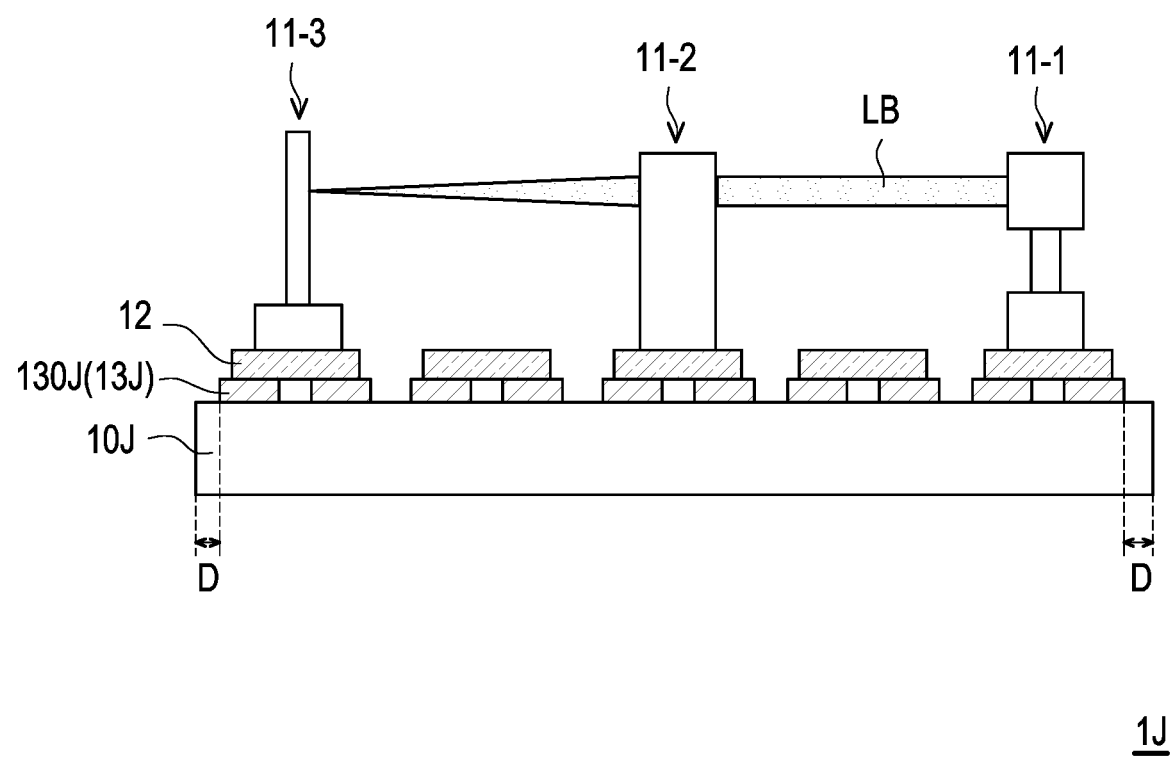

With reference to FIG. 17, an electronic device 1J may include a circuit substrate 10J, a plurality of electronic components (e.g., an electronic component 11-1, an electronic component 11-2, and an electronic component 11-3), a plurality of carriers 12, and a bonding layer 13J. The circuit substrate 10J is a display or an optical table, for example, and the circuit substrate 10J may have components or devices for controlling the plurality of electronic components. The plurality of electronic components are a plurality of optical components, for example. For example, the electronic component 11-1 is a light source, for example but not limited to a light-emitting diode or a laser. The electronic component 11-2 is an actuating optical component, for example but not limited to a variable focus lens element. The electronic component 11-3 is a sensor, for example but not limited to a charge coupled device. The plurality of carriers 12 may include a plurality of semiconductor components or a plurality of control components to control the plurality of electronic components. The bonding layer 13J may be a patterned bonding layer and include a plurality of conductive members 130J. The conductive member 130J may include a conductive bump (e.g., a solder ball), a conductive adhesive, or an anisotropic conductive film, but not limited thereto. The plurality of carriers 12 may be electrically connected to corresponding pads (not shown) or circuits (not shown) in the circuit substrate 10J through the plurality of conductive members 130J.

In some embodiments, components (e.g., driving components) in the circuit substrate 10J and the plurality of carriers 12 may perform signal transmission through a physical circuit, such that components in the circuit substrate 10J may control the plurality of carriers 12 and accordingly control the plurality of electronic components. Alternatively, components (e.g., driving components) in the circuit substrate 10J and the plurality of carriers 12 may perform signal transmission through a wireless communication or sensing device.

In summary of the foregoing, in the embodiments of the disclosure, by bonding the plurality of carriers to the circuit substrate and through the width design of the gap between the plurality of carriers, these may help dissipate heat, improve the evenness of heat distribution, reduce impact of heat on the performance of the electronic components, mitigate deformation or warpage caused by thermal stress, or improve the overall flatness, reliability, or yield.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

Although the embodiments of the disclosure and the advantages thereof have been disclosed as above, it should be understood that, any person skilled in the art may make variations, replacements, and modifications, and features among the embodiments may be arbitrarily mixed and replaced with each other into other newly formed embodiments without departing from the spirit and scope of the disclosure. In addition, the protection scope of the disclosure is not limited to the process, machine, manufacture, composition of matters, device, method, and step in the specifically described embodiments in the specification. Any person skilled in the art can understand from the content of the disclosure that the existing or to-be-developed process, machine, manufacture, composition of matters, device, method, or step may be used according to the disclosure as long as the substantially same function can be implemented or the substantially same result can be obtained in the embodiments described herein. Therefore, the protection scope of the disclosure includes the above-mentioned process, machine, manufacture, composition of matters, device, method, or step. Moreover, each claim forms an individual embodiment, and the protection scope of the disclosure also includes a combination of each of the claims and embodiments. The protection scope of the disclosure should be subject to the appended claims.

What is claimed is:

1. An electronic device comprising:
   a circuit substrate comprising a circuit layer;
   a plurality of electronic components disposed on the circuit substrate, wherein the circuit layer is electrically connected to at least one of the plurality of electronic components;
   a plurality of carriers disposed on the circuit substrate; and
   a bonding layer bonding the plurality of carriers to the circuit substrate,
   wherein at least one gap is between the plurality of carriers, a width of the gap is Wg, an average width of the plurality of carriers is Wa, a width of the circuit substrate is Wc, and the electronic device satisfies:

$$Wa*2*10^{-4}<Wg<(Wc-Wa*2).$$

2. The electronic device according to claim 1, wherein the plurality of carriers comprise a plurality of heat-conducting components, a plurality of insulating components, a plurality of conductive components, a plurality of semiconductor components, a plurality of control components, a plurality of piezoelectric components, a plurality of magnetic components, a plurality of electrostatic protection components, a plurality of signal shielding components, a plurality of signal transmission components, a plurality of thermoelectric components, or a combination thereof.

3. The electronic device according to claim 1, wherein the circuit layer and the plurality of carriers are respectively located on opposite sides of the circuit substrate, and the electronic device further comprises:
   a trace layer disposed between the circuit layer and the bonding layer; and
   a wire disposed on a lateral side of the circuit substrate and electrically connecting the circuit layer and the trace layer.

4. The electronic device according to claim 3, wherein at least one of the plurality of carriers is electrically connected to the trace layer through a conductive member, and the bonding layer surrounds the conductive member.

5. The electronic device according to claim 3, wherein the bonding layer comprises an optical clear adhesive, an optical clear resin, a double-sided adhesive, or an elastic adhesive.

6. The electronic device according to claim 1, wherein the circuit layer and the plurality of carriers are respectively located on opposite sides of the circuit substrate, and the electronic device further comprises:
   a trace layer disposed between the circuit layer and the bonding layer; and
   a conductive via disposed in the circuit substrate and electrically connecting the circuit layer and the trace layer.

7. The electronic device according to claim 6, wherein at least one of the plurality of carriers is electrically connected to the trace layer through a conductive member, and the bonding layer surrounds the conductive member.

8. The electronic device according to claim 6, wherein the bonding layer comprises an optical clear adhesive, an optical clear resin, a double-sided adhesive, or an elastic adhesive.

9. The electronic device according to claim 1, wherein the electronic device further satisfies:

$$Wc*10^{-6}<Wa<Wc.$$

10. The electronic device according to claim 1, wherein a distance between an edge of the plurality of carriers and a lateral side of the circuit substrate is D, and the electronic device further satisfies:

$$Wc*10^{-9}<D<Wa.$$

11. The electronic device according to claim 1, wherein the plurality of carriers comprise a first carrier and a second carrier, a thickness of the first carrier is greater than a thickness of the second carrier, and a second thickness of the bonding layer between the second carrier and the circuit substrate is greater than a first thickness of the bonding layer between the first carrier and the circuit substrate.

12. The electronic device according to claim 1, wherein the circuit layer and the plurality of carriers are located on the same side of the circuit substrate, and the bonding layer comprises a conductive bump, a conductive adhesive, or an anisotropic conductive film.

13. A manufacturing method of an electronic device, comprising:
   providing a circuit substrate; and
   fixing a plurality of carriers to the circuit substrate by a bonding layer,
   wherein at least one gap is between the plurality of carriers, a width of the gap is Wg, an average width of the plurality of carriers is Wa, a width of the circuit substrate is Wc, and the electronic device satisfies:

$$Wa*2*10^{-4}<Wg<(Wc-Wa*2).$$

14. The method according to claim 13, further comprising:
   forming another bonding layer in the gap.

15. The method according to claim 14, wherein the another bonding layer comprises an optical clear adhesive, an optical clear resin, a double-sided adhesive, or an elastic adhesive.

16. The method according to claim 13, wherein the circuit substrate and the plurality of carriers are aligned by a packaging jig.

17. The method according to claim 13, wherein the circuit substrate and the plurality of carriers are positioned by an alignment pattern.

18. The method according to claim 17, wherein the circuit substrate has a first alignment pattern, at least one of the plurality of carriers has a second alignment pattern, and the method further comprises:
   utilizing an image capturing component to observe whether the first alignment pattern is aligned with the second alignment pattern.

19. The method according to claim 18, further comprising:
   utilizing the image capturing component or other image capturing components to observe whether the electronic device satisfies $Wc*10^{-9}<D<Wa$, where D is a distance between an edge of the plurality of carriers and a lateral side of the circuit substrate.

20. The method according to claim 13, wherein the bonding layer comprises an optical clear adhesive, an optical clear resin, a double-sided adhesive, or an elastic adhesive.

* * * * *